(12) United States Patent
Stephens, IV et al.

(10) Patent No.: US 9,590,388 B2
(45) Date of Patent: Mar. 7, 2017

(54) MICROCHANNEL COOLER FOR A SINGLE LASER DIODE EMITTER BASED SYSTEM

(75) Inventors: Edward F. Stephens, IV, Golden Eagle, IL (US); Courtney Ryan Feeler, St. Louis, MO (US); Jeremy Scott Junghans, St. Charles, MO (US)

(73) Assignee: Northrop Grumman Systems Corp., Los Angeles, CA (US)

( * ) Notice: Subject to any disclaimer, the term of this patent is extended or adjusted under 35 U.S.C. 154(b) by 973 days.

(21) Appl. No.: 13/004,536

(22) Filed: Jan. 11, 2011

(65) Prior Publication Data
US 2012/0177073 A1   Jul. 12, 2012

(51) Int. Cl.
*H01S 5/024*   (2006.01)

(52) U.S. Cl.
CPC ................................ *H01S 5/02423* (2013.01)

(58) Field of Classification Search
CPC .................................................. H01S 5/02423
See application file for complete search history.

(56) References Cited

U.S. PATENT DOCUMENTS

| 3,303,432 A | 2/1967 | Garfinkel et al. |
| 3,339,151 A | 8/1967 | Smith |
| 3,590,248 A | 6/1971 | Chatterton, Jr. |
| 3,654,497 A | 4/1972 | Dyment et al. |
| 3,683,296 A | 8/1972 | Scalise |
| 3,771,031 A | 11/1973 | Kay |
| 3,802,967 A | 4/1974 | Ladany et al. |
| 3,896,473 A | 7/1975 | DiLorenzo et al. |
| 3,958,263 A | 5/1976 | Panish et al. |

(Continued)

FOREIGN PATENT DOCUMENTS

| EP | 0 458 469 A1 | 4/1991 | |
| EP | 0 458 469 A1 | 11/1991 | ............ 257/675 |

(Continued)

OTHER PUBLICATIONS

R. E. Hendron, et al. "Stackable wafer thin coolers for high power laser diode arrays," SPIE vol. 1219 Laser-Diode Technology and Applications II, pp. 330 to 340, dated Mar. 1990; 11 pages.

(Continued)

*Primary Examiner* — Jessica Manno
*Assistant Examiner* — Sean Hagan
(74) *Attorney, Agent, or Firm* — Nixon Peabody LLP

(57) ABSTRACT

A laser system that allows transverse arrangement of laser emitters around a laser medium. The system includes a laser medium with a coolant source and electrical controls. A pump layer has a mounting surface, an opposite bottom surface and a center aperture through which the laser medium is inserted. Laser diode emitters are disposed on the mounting surface circumferentially around the laser medium. An intermediate layer has at least one radial channel in fluid communication with the coolant conduit. The intermediate layer is in contact with the bottom surface. A middle layer has micro-channels formed therethrough and a center aperture. The micro-channels are radially arranged around the center aperture and the middle layer is in contact with the intermediate layer. The coolant source is fluidly coupled to the micro-channels to allow coolant to be directed through the microchannels and the radial channel to impinge on the bottom surface.

21 Claims, 7 Drawing Sheets

(56) References Cited

U.S. PATENT DOCUMENTS

| | | | |
|---|---|---|---|
| 3,962,655 A | 6/1976 | Selway et al. | |
| 4,057,101 A | 11/1977 | Ruka et al. | |
| 4,092,614 A | 5/1978 | Sakuma et al. | |
| 4,219,072 A | 8/1980 | Barlow | |
| 4,228,406 A | 10/1980 | Lewis et al. | |
| 4,233,567 A | 11/1980 | Chernoch | |
| 4,315,225 A | 2/1982 | Allen, Jr. et al. | |
| 4,383,270 A | 5/1983 | Schelhorn | |
| 4,393,393 A | 7/1983 | Allen, Jr. et al. | |
| 4,415,234 A | 11/1983 | Meyers | |
| 4,454,602 A | 6/1984 | Smith | |
| 4,573,067 A | 2/1986 | Tuckermann et al. | |
| 4,617,585 A | 10/1986 | Yasui | |
| 4,673,030 A | 6/1987 | Basiulis | |
| 4,709,750 A | 12/1987 | White | |
| 4,716,568 A | 12/1987 | Scifres et al. | |
| 4,730,324 A | 3/1988 | Azad | |
| 4,782,222 A | 11/1988 | Ragle et al. | |
| 4,831,629 A | 5/1989 | Paoli et al. | |
| 4,837,768 A | 6/1989 | Schmid | |
| 4,847,848 A | 7/1989 | Inoue et al. | |
| 4,852,109 A | 7/1989 | Kuchar | |
| 4,877,641 A | 10/1989 | Dory | |
| 4,881,233 A | 11/1989 | von Arb et al. | |
| 4,881,237 A | 11/1989 | Donnelly | |
| 4,899,204 A | 2/1990 | Rosen et al. | |
| 4,901,330 A | 2/1990 | Wolfram et al. | |
| 4,949,346 A | 8/1990 | Kuper et al. | |
| 4,963,741 A | 10/1990 | McMullin | |
| 4,975,923 A | 12/1990 | Buus et al. | |
| 5,001,355 A | 3/1991 | Rosen et al. | |
| 5,005,640 A | 4/1991 | Lapinski et al. | |
| 5,022,042 A | 6/1991 | Bradley | |
| 5,031,187 A | 7/1991 | Orenstein et al. | |
| 5,040,187 A | 8/1991 | Karpinski | |
| 5,073,838 A | 12/1991 | Ames | |
| 5,076,348 A | 12/1991 | Bluege | |
| 5,084,888 A | 1/1992 | Tajima et al. | |
| 5,099,214 A | 3/1992 | Rosen et al. | |
| 5,099,488 A | 3/1992 | Ahrabi et al. | |
| 5,105,429 A | 4/1992 | Mundinger et al. | |
| 5,115,445 A | 5/1992 | Mooradian | |
| 5,128,951 A | 7/1992 | Karpinski | |
| 5,156,999 A | 10/1992 | Lee | |
| 5,163,064 A | 11/1992 | Kim et al. | |
| 5,212,699 A | 5/1993 | Masuko et al. | |
| 5,216,263 A | 6/1993 | Paoli | |
| 5,216,688 A * | 6/1993 | Kortz et al. | 372/36 |
| 5,220,954 A | 6/1993 | Longardner et al. | |
| 5,253,260 A | 10/1993 | Palombo | |
| 5,265,113 A | 11/1993 | Halldórsson et al. | |
| 5,284,790 A | 2/1994 | Karpinski | |
| 5,287,375 A | 2/1994 | Fujimoto | |
| 5,305,344 A | 4/1994 | Patel | |
| 5,311,535 A | 5/1994 | Karpinski | |
| 5,311,536 A | 5/1994 | Paoli et al. | |
| 5,315,154 A | 5/1994 | Elwell | |
| 5,323,411 A | 6/1994 | Shirasaka et al. | |
| 5,325,384 A | 6/1994 | Herb et al. | |
| 5,337,325 A | 8/1994 | Hwang | |
| 5,351,259 A | 9/1994 | Ishimori et al. | |
| 5,388,755 A | 2/1995 | Baxter | |
| 5,394,426 A | 2/1995 | Joslin | |
| 5,394,427 A | 2/1995 | McMinn et al. | |
| 5,402,436 A | 3/1995 | Paoli | |
| 5,402,437 A | 3/1995 | Mooradian | |
| 5,438,580 A | 8/1995 | Patel et al. | |
| 5,485,482 A | 1/1996 | Selker et al. | |
| 5,520,244 A | 5/1996 | Mundinger et al. | |
| 5,526,373 A | 6/1996 | Karpinski | |
| 5,663,979 A | 9/1997 | Marshall | |
| 5,734,672 A | 3/1998 | McMinn et al. | |
| 5,745,514 A | 4/1998 | Patel et al. | |
| 5,764,675 A | 6/1998 | Juhala | |
| 5,834,840 A | 11/1998 | Robbins et al. | |
| 5,835,515 A | 11/1998 | Huang | |
| 5,835,518 A | 11/1998 | Mundinger et al. | |
| 5,898,211 A | 4/1999 | Marshall et al. | |
| 5,903,583 A | 5/1999 | Ullman et al. | |
| 5,978,407 A * | 11/1999 | Chang et al. | 372/72 |
| 5,985,684 A | 11/1999 | Marshall et al. | |
| 5,987,043 A | 11/1999 | Brown et al. | |
| 6,245,307 B1 | 6/2001 | Inui et al. | |
| 6,307,871 B1 | 10/2001 | Heberle | |
| 6,310,900 B1 | 10/2001 | Stephens et al. | |
| 6,330,259 B1 | 12/2001 | Dahm | |
| 6,351,478 B1 | 2/2002 | Heberle | |
| 6,352,873 B1 | 3/2002 | Hoden | |
| 6,397,618 B1 | 6/2002 | Chu et al. | |
| 6,480,514 B1 | 11/2002 | Lorenzen et al. | |
| 6,570,895 B2 | 5/2003 | Heberle | |
| 6,636,538 B1 | 10/2003 | Stephens | |
| 6,647,035 B1 | 11/2003 | Freitas et al. | |
| 6,647,037 B2 | 11/2003 | Irwin | |
| 6,661,827 B2 | 12/2003 | Lam et al. | |
| 6,728,275 B2 | 4/2004 | Stephens et al. | |
| 6,728,278 B2 | 4/2004 | Kahen et al. | |
| 6,865,200 B2 | 3/2005 | Takigawa et al. | |
| 6,919,525 B2 | 7/2005 | Pinneo | |
| 6,970,485 B1 | 11/2005 | Kitayama et al. | |
| 7,126,974 B1 | 10/2006 | Dong et al. | |
| 7,200,161 B2 * | 4/2007 | Vetrovec | 372/70 |
| 7,223,618 B1 | 5/2007 | Irwin | |
| 7,262,467 B2 | 8/2007 | Kelbertau | |
| 7,584,628 B2 | 9/2009 | Harpole | |
| 7,656,915 B2 | 2/2010 | Stephens et al. | |
| 7,957,439 B2 | 6/2011 | Stephens et al. | |
| 8,345,720 B2 | 1/2013 | Stephens et al. | |
| 2002/0018498 A1 | 2/2002 | Heberle | 372/35 |
| 2005/0051891 A1 | 3/2005 | Yoshida et al. | 257/720 |
| 2006/0045154 A1 | 3/2006 | Linares | 372/36 |
| 2007/0160098 A1* | 7/2007 | Morimoto | 372/38.09 |
| 2008/0025357 A1* | 1/2008 | Coleman et al. | 372/36 |

FOREIGN PATENT DOCUMENTS

| | | | |
|---|---|---|---|
| EP | 0 550 996 A1 | 1/1992 | H01S 3/025 |
| EP | 0550 996 B1 | 12/1992 | |
| EP | 0 634 822 B1 | 7/1994 | |
| EP | 0 805 527 B1 | 4/1997 | |
| EP | 0 833 419 A1 | 9/1997 | |
| JP | 60211992 | 10/1985 | |
| JP | 01123493 A | 5/1989 | |
| JP | 02281782 | 11/1990 | |
| JP | 3-6875 | 1/1991 | |
| JP | 03016290 A | 1/1991 | |
| JP | 4-359207 | 6/1991 | |
| JP | 04023381 | 1/1992 | |
| JP | 04-314375 | 11/1992 | H01S 3/18 |
| JP | 6-13717 | 1/1993 | |
| JP | A 9-181376 | 7/1997 | |
| JP | A 10-178222 | 6/1998 | |
| JP | 2002-353551 A | 12/2002 | H01S 5/024 |
| JP | 2004-146720 A | 5/2004 | H01S 5/024 |
| JP | 2004-356429 A | 12/2004 | H01S 5/022 |
| JP | WO 2006/006455 A1 | 1/2006 | H01S 5/024 |
| JP | 2006-032406 A | 2/2006 | H01S 5/022 |
| WO | WO 96/28846 | 9/1996 | |

OTHER PUBLICATIONS

B. Welber, *Heat Sink for High Powered Injection Lasers*, IBM Technical Disclosure Bulletin, (Sep. 1965) (2 pages).

Ahearn, W.E., "Thermal Spacer for Room Temperature Close-Packed GaAs Laser Arrays," IBM Technical Disclosure Bulleting, vol. 12, No. 12, p. 2311, May 1970.

IBM Corp. "Heat Sink Assembly for Tab-Mounted Devices," IBM Technical Disclosure Bulletin, vol. 31, No. 6, pp. 372-373, Nov. 1988 (2 pages).

IBM Corp. "Circuit Module Cooling With Multiple Pistons Contacting a Heat Spreader/Electrical Buffer Plate in Contact With Chip," IBM Technical Disclosure Bulletin, vol. 31, No. 12, pp. 5-7, May 1989 (2 pages).

(56) References Cited

OTHER PUBLICATIONS

Endriz, John G. "High Power Diode Laser Arrays," IEEE Journal of Quantum Electronics, No. 4, pp. 952-965, Apr. 1992 (14 pages).
Sergey K. Gordeev et al., *SiC-Skeleton Cemented Diamond a Novel Engineering Material With Unique Properties*, Ceramic Engineering and Science Proceedings, vol. 21, No. 3, 753-760 (2000) (8 pages).
Article, "Micro Thermal Management of High-Power Diode Laser Bars," Dirk Lorenzen et al., IEEE Transactions on Industrial Electronics, vol. 48, No. 2, Apr. 2001, pp. 286-297 (12 pages).
Article, "Analysis of Substrates for Single Emitter Laser Diodes," Tapani M. Alander et al., Institute of Electronics, Sep. 2003, vol. 125, pp. 313-318 (6 pages).
Advancing Microelectronics Catalog, vol. 32, No. 3, May/Jun. 2005 (40 pages).
Michael Leers et al., *Expansion-Matched Passively Cooled Heatsinks With Low Thermal Resistance for High Power Diode Laser Bars*, Proceedings of the SPIE, vol. 6104, 20-29 (Feb. 2006) (10 pages).
Peter Z. Shi, K.M. Chua, Stephen C.K. Wong, & Y.M. Tan, *Design and Performance Optimization of Miniature Heat Pipes in LTCC*, Journal of Physics: Conference Series Institute of Physics Publishing, Bristol, GB, vol. 34, No. 1, 142-147 (Apr. 1, 2006) (6 pages).
V. Glaw, R. Hahn, A. Paredes, U. Hein, O. Ehrmann, H. Reichl; 1997 International Symposium on Advanced Packaging Materials, Laser Machining of Ceramics Silicon for MCM-D Applications,(1997) (4pages).
PCT International Search Report for International Application No. PCT/US2007/016517 mailed on Dec. 4, 2008 (4 pages).
PCT International Written Opinion for International Application No. PCT/US2007/016517 mailed on Dec. 4, 2008 (7 pages).
PCT International Search Report for International Application No. PCT/US2007/016740 mailed on Feb. 1, 2008 (5 pages).

\* cited by examiner

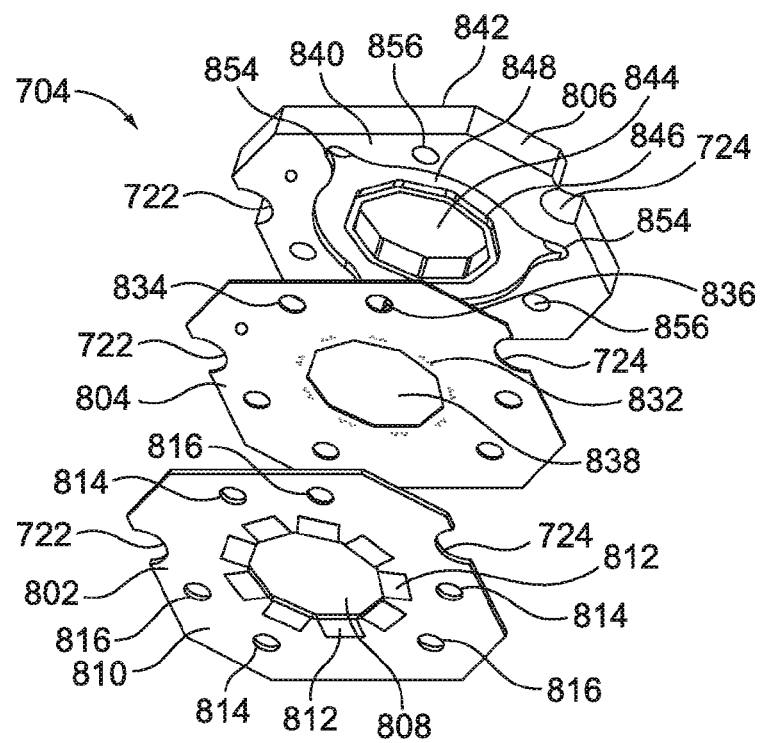
FIG. 8A
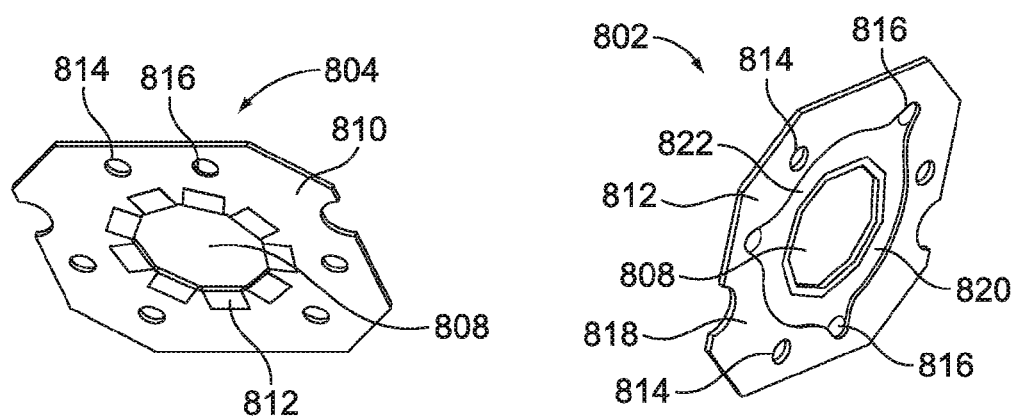
FIG. 8B  FIG. 8C

MICROCHANNEL COOLER FOR A SINGLE LASER DIODE EMITTER BASED SYSTEM

TECHNICAL FIELD

The present invention relates generally to laser diode systems and, in particular, to a layer based cooling mechanism for a laser diode that provides heat dissipation allowing the use of emitter laser diodes in transverse relation to a laser medium.

BACKGROUND

Semiconductor laser diodes have numerous advantages. One advantage is the small size of the laser diodes. For example, an active region of a laser diode has a width that is typically a submicron to a few microns, a height that is usually no more than a fraction of a millimeter, and a length that is typically less than about a millimeter. Internal reflective surfaces, which produce emission in one direction, are formed by cleaving the substrate from which the laser diodes are produced and, thus, have high mechanical stability.

High efficiencies are possible with semiconductor laser diodes with some having external quantum efficiencies near 70%. Semiconductor laser diodes produce radiation at wavelengths from about 20 to about 0.7 microns depending on the semiconductor alloy that is used. For example, laser diodes manufactured from gallium arsenide with aluminum doping ("AlGaAs") emit radiation at approximately 0.8 microns (~800 nm), which is near the absorption spectrum of common solid state laser rods and slabs manufactured from Neodymium-doped, Yttrium-Aluminum Garnet ("Nd:YAG"), and other crystals and glasses. Thus, semiconductor laser diodes can be used as an optical pumping source for larger, solid state laser systems.

Universal utilization of semiconductor laser diodes has been restricted by thermally related problems. These problems are associated with the large heat dissipation per unit area of the laser diodes resulting in elevated junction temperatures and stresses induced by thermal cycling. Laser diode efficiency and the service life of the laser diode are decreased as the operating temperature in the junction of the laser diode increases.

Furthermore, the emitted wavelength of a laser diode is a function of its junction temperature. Thus, when a specific output wavelength is desired, maintaining a constant junction temperature is essential. For example, AlGaAs laser diodes that are used to pump an Nd:YAG rod or slab emit radiation at about 808 nm because this is the wavelength at which optimum energy absorption exists in the Nd:YAG. However, for every 3.5° C. to 4.0° C. deviation in the junction temperature of the AlGaAs laser diode, the wavelength shifts 1 nm. Accordingly, controlling the junction temperature and, thus, properly dissipating the heat is critical.

When solid state laser rods or slabs are pumped by laser diodes, dissipation of the heat becomes more problematic because it becomes necessary to densely pack multiple individual diodes into arrays that generate the required amounts of input power for the larger, solid state laser rod or slab. However, when the packing density of the individual laser diodes is increased, the space available for extraction of heat from the individual laser diodes decreases. This aggravates the problem of heat extraction from the arrays of densely packed individual diodes.

Currently, laser emitters may be in a laser diode bar having strips of laser diodes or single-emitter laser diode chips. A laser diode bar consists of a linear array of physical connected single emitter laser diodes. The laser diode bar configuration requires the emitters to be operated in parallel and the individual emitters cannot be electrically isolated because the emitters are physically connected. A number of laser diode bars are arranged axially around a laser medium. However, since a laser diode bar is of a certain width, the ability to place such diodes in optimal proximity to a laser medium is limited and therefore results in poor angular pumping uniformity and induces stress birefringence thus limiting gain. For example, five laser bars each having 25 laser diodes may be arranged in a pentagon shape, lengthwise, around a laser rod. The pitch or number of bars that may be placed around the laser rod is also limited. The bar configuration also has several other problems. For example, the failure of one emitter on a bar may cause total failure because the emitters are coupled in series together.

An alternative to the laser diode bars are much smaller single emitter laser diodes arranged transversely around the perimeter of the laser medium. The use of individual emitters may be implemented on a thinner substrate because such emitters may be attached to the surface of a layer. Individual layers may allow integrated protection circuitry and may be capable of hard soldering to other components. However, the use of single emitters requires additional support elements which inhibit compact arrays due to the increased thickness around the laser medium. Further, single emitters require additional electrical components because the emitters must be physically separated.

Thus, it would be desirable to have a pump source solution that combines the compactness of the laser bar arrays and the effectiveness of micro-channel cooling with the robustness of single emitters. The use of single emitters in a compact arrangement to allow a ring shaped arrangement of laser diodes transversely around a laser medium would also be desirable.

SUMMARY

According to one example, a micro channel cooled laser apparatus includes a laser medium and a pump layer having a mounting surface, an opposite bottom surface and a center aperture through which the laser medium is inserted. A plurality of laser diode emitters are disposed on the mounting surface of the pump layer circumferentially around the laser medium and emitting light directed at the laser medium. An intermediate layer has at least one radial channel. The intermediate layer is in contact with the bottom surface of the pump layer. A middle layer has a plurality of micro-channels formed therethrough and a center aperture. The micro-channels are radially arranged around the center aperture and the middle layer in contact with the intermediate layer. A coolant source is fluidly coupled to the micro-channels to allow coolant to be directed through the microchannels and the radial channel to impinge on the bottom surface of the pump layer and flow through the at radial channel.

Another example is a laser pump module including a laser medium having a length. A plurality of ceramic coolers are arranged along the length of the laser medium. Each of the plurality of ceramic coolers including multiple layers having internal coolant flow channels for passing coolant fluid therethrough. Each of the plurality of ceramic coolers has a center aperture through which the laser medium is positioned. A plurality of groups of emitters for emitting energy in a direction transverse to the length are mounted on a corresponding one of the ceramic coolers such that the emitters are individually emitting energy toward the center aperture and into the laser medium.

Another example is a laser pump system including a laser medium having a length. A plurality of laser emitters are located in transverse relation to the length of the laser medium. A pump layer has a mounting surface supporting the laser emitters, an opposite bottom surface, a center aperture and at least one fluid conduit located near the circumference of the pump layer. An intermediate layer has a channel system to guide coolant to contact against the bottom surface of the pump layer substantially opposite the laser emitters and flow through the channel system to the at least one fluid conduit.

The above summary of the present invention is not intended to represent each embodiment or every aspect of the present invention. The detailed description and Figures will describe many of the embodiments and aspects of the present invention.

BRIEF DESCRIPTION OF THE DRAWINGS

The foregoing and other advantages of the invention will become apparent upon reading the following detailed description and upon reference to the drawings.

FIG. 8A is an exploded perspective view of one of the emitter modules in the laser system in FIG. 7A;

FIGS. 8B and 8C are perspective views of the pump layer of the emitter module in FIG. 8A;

Figure 1:
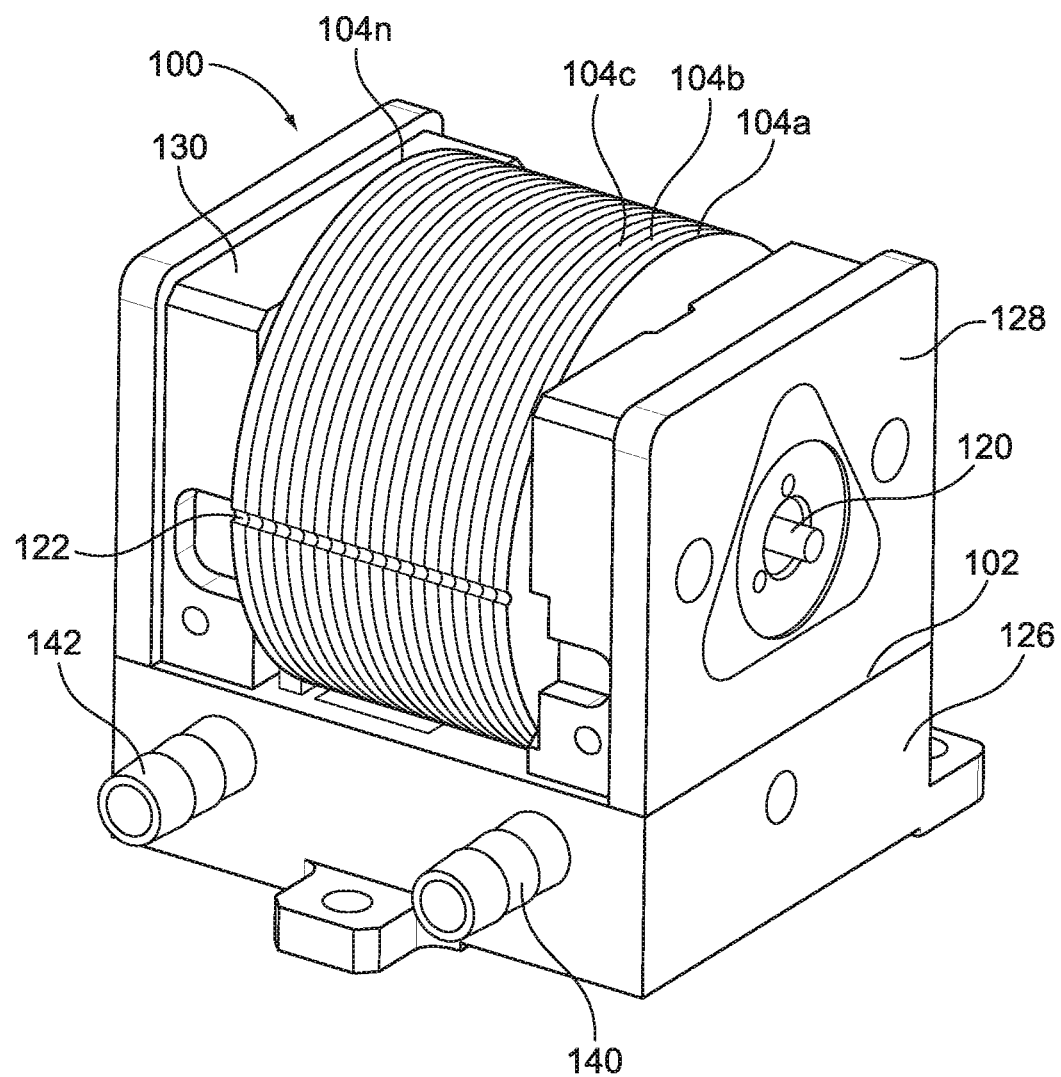
FIG. 1 is a perspective view of a laser assembly with a series of cylindrical emitter modules.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DESCRIPTION OF ILLUSTRATIVE EMBODIMENTS

FIG. 1 is a perspective view of a laser system 100 allowing transverse emission of light from emitters to a laser medium such as a laser rod 120. The laser system 100 includes a transverse coolant system 102 and a series of emitter modules 104a, 104b, 104c to 104n. As will be explained below, the emitter modules 104a, 104b, 104c to 104n include ceramic coolers arranged along the length of the laser rod 120. Each of ceramic coolers of the emitter modules 104a, 104b, 104c to 104n include multiple layers having internal coolant flow channels for passing coolant fluid. The laser rod 120 is at the center of the emitter modules 104a, 104b, 104c to 104n. In this example, there are twenty emitter modules 104a, 104b, 104c to 104n. The laser rod 120 is pumped by the emitters on the ceramic coolers of the emitter modules 104a, 104b, 104c to 104n which are arranged in transverse relation to the laser rod 120 allowing relatively greater uniform pumping of light from the emitter modules 104a, 104b, 104c to 104n. The emitter modules 104a, 104b, 104c to 104n each include a pair of notches 122 and 124. The emitter modules 104a, 104b, 104c to 104n rest on a chassis 126 with a front manifold 128 and a rear manifold 130. The emitter modules 104a, 104b, 104c to 104n are aligned together by rods that are fixed in the respective notches 122 and 124 and held by the respective manifolds 128 and 130.

The laser rod 120 in this example is a Neodymium-doped, Yttrium-Aluminum Garnet ("Nd:YAG"). Although there are twenty emitter modules in this example, the number of emitter modules may be more or less depending on the desired power output of the laser system 100 with fewer emitter modules resulting in lower power output and more emitter modules resulting in greater power output. As will be explained the transverse coolant system 102 is fluidly coupled to a pump (not shown) that pumps coolant fluid such as water to an input pipe 140 from the emitter module 104a through each of the other emitter modules 104b, 104c to 104n through the rear manifold 130 to an output pipe 142. The coolant fluid is pumped through the emitter modules 104a, 104b, 104c to 104n via the pump and removes heat generated by the light emitters in the emitter modules 104a, 104b, 104c to 104n. An electrical controller provides power to the light emitters in the emitter modules 104a, 104b, 104c to 104n.

Figure 2:
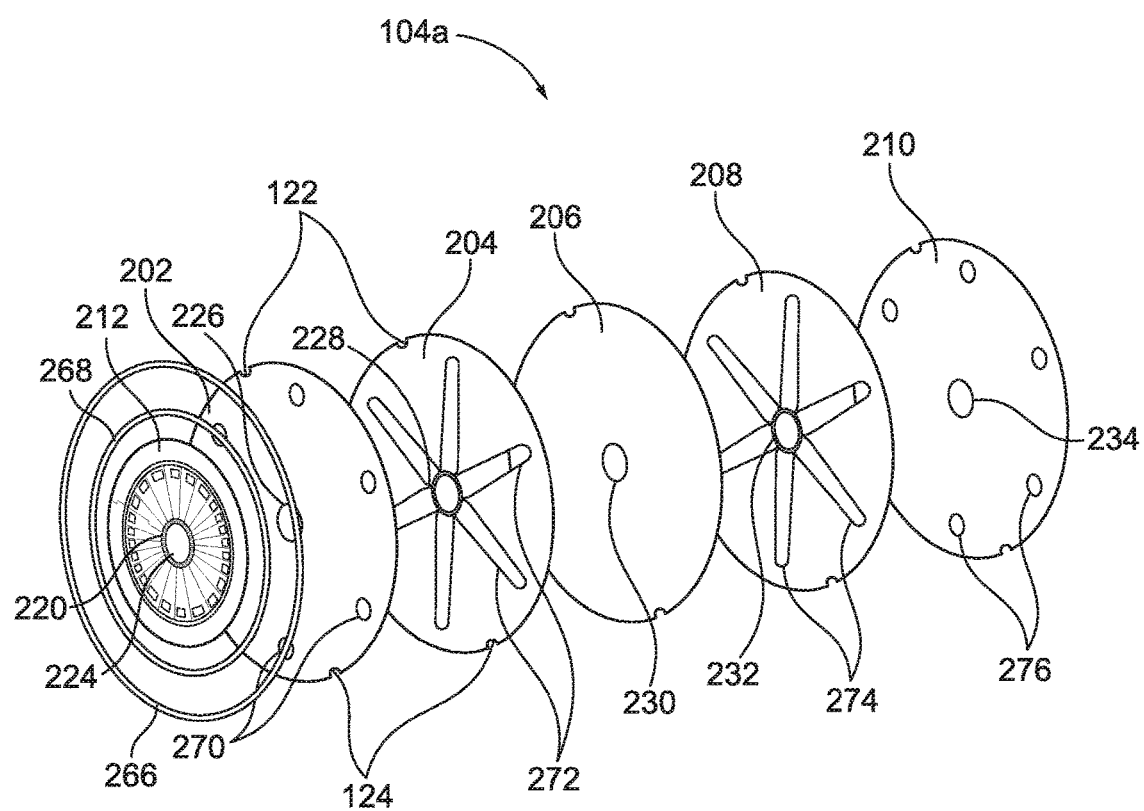
FIG. 2 is an exploded view of the components of one of the emitter modules of the laser assembly of FIG. 1.

FIG. 2 is an exploded perspective view of the components of one of the emitter modules 104a-n such as the emitter module 104a in FIG. 1 having one set of single laser diode emitters that pump light to the laser rod 120 of the laser system 100. The emitter module 104a includes a top or pump layer 202, a top intermediate layer 204, a microchannel middle layer 206, a bottom intermediate layer 208 and a bottom layer 210. A conductor layer 212 is fabricated on the pump layer 202 and includes a series of single emitter chips 220 that are mounted in angular transverse relationship to a center aperture 224 formed by the conductors in the conductor layer 212. The emitter chips 220 are laser diodes that have a single emitting region that emits light transverse to the laser rod 120 as shown by the arrows in FIG. 3. The uniform arrangement of the emitter chips 220 around the circular center aperture 224 results in more uniform light emission to the laser rod 120. Although, the pump layer 202 is the top layer of the emitter module 104a, it is to be understood that there may be other types of emitter structures having additional layers over the pump layer 202.

Each of the layers 202, 204, 206, 208 and 210 are circular in shape in this example and include a center aperture 226, 228, 230, 232 and 234 respectively. The laser rod 120 in FIG. 1 is inserted through the center apertures 226, 228, 230, 232 and 234 of the layers 202, 204, 206, 208 and 210. The apertures 226, 228, 230, 232 and 234 are circular in shape and slightly larger in diameter than the diameter of the laser rod 120.

Figure 3:
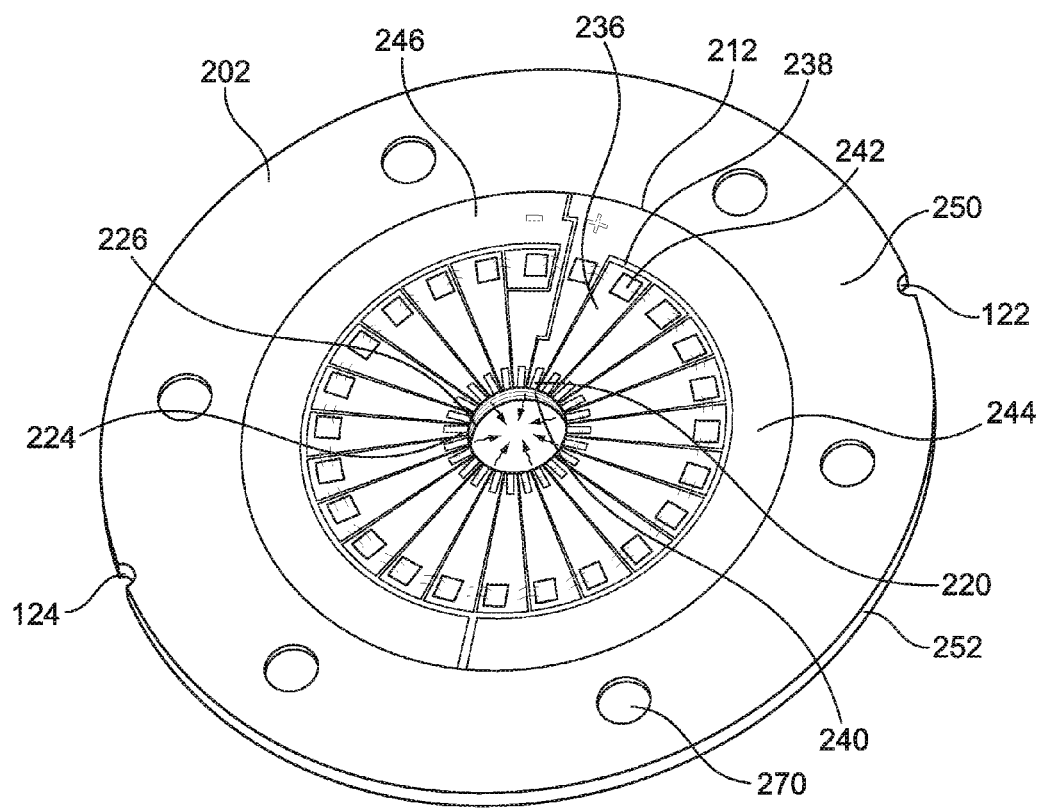
FIG. 3 is a perspective view of the pump layer of the emitter module in FIG. 2.

As shown in FIG. 3, the emitter chips 220 are mounted on individual radial conductors 236 in the conductor layer 212. The individual radial conductors 236 are fabricated from conductive material. The radial conductors 236 are roughly triangle shaped and each have a distal end 238 and an opposite proximal end 240 which is near the aperture 224. The emitter chips 220 include the single laser diodes which pump light into the laser rod 120 which is located in the aperture 224 of the conductor layer 212. Each of the single laser diodes has an approximate 45° cone angle of emitted light. Alternatively, the emitter chips 220 may be replaced with small laser bars having a small number of emitters fabricated in a row such as five emitters. Such short emitter bars have a relatively short width with emitter stripes and may still be arranged in relatively transverse relation to the laser rod 120 to maintain uniform light emission to the laser rod 120.

Figure 4:
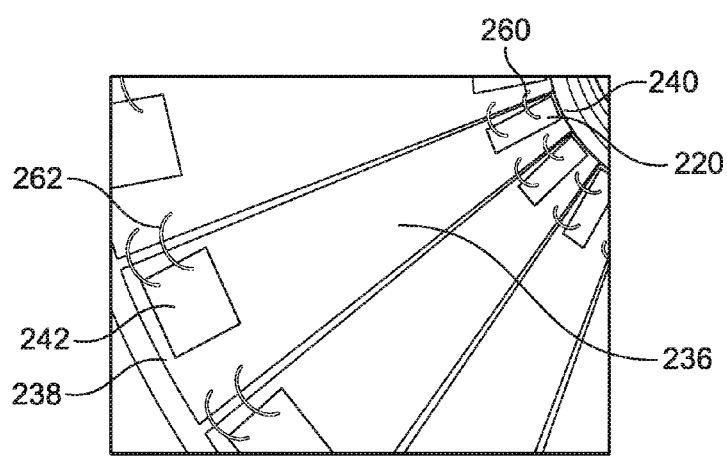
FIG. 4 is perspective view of one of the single laser emitters on the emitter modules of the laser assembly of FIG. 1.

FIG. 4 is a close-up view of one of the individual radial conductors 236 in FIG. 3. With respect to both FIGS. 3-4, an open circuit bypass chip 242 is disposed on the distal end 238 of each of the radial conductors 236. The pump layer 202 has a mounting surface 250 and an opposite bottom surface 252. The radial conductors 236 are fabricated on the mounting surface 250 of the layer 202. A positive conductor lead 244 and a negative conductor lead 246 are also disposed on the mounting surface 250 of the layer 202.

The radial conductors 236 and positive and negative conductors 244 and 246 are a solid, solderable metal (e.g., gold), for attaching the laser diode emitters 220. The conductors 236, 244 and 246 are deposited and etched on the mounting surface 250 of the pump layer 202. Alternatively, the conductor layer 212 can be made using any electrically conductive material and/or their respective alloys, including gold, nickel, titanium, platinum, etc. The mounting surface 250 of the pump layer 202 is preferably lapped and polished prior to applying the conductor layer 212.

Each of the single emitters 220 are chips that have bonding wires 260 that are coupled to the neighboring conductors 236. Similarly, each of the open circuit bypass chips 242 are coupled via bonding wires 262 that are coupled to the neighboring conductors 236. The conductors 236 are therefore in electrical contact with both the positive and negative conductors 244 and 246 through the emitter chips 220. A series circuit is thus formed from the positive conductor 244 to each of the single emitter chips 220 to the negative conductor 246. The open circuit bypass chips 242 include a bypass diode (not shown) that has the function of conducting current when current is detected on the radial conductor 236. An example of such an open circuit bypass chip is described in U.S. Pat. No. 6,728,275 hereby incorporated by reference. Thus, when a single emitter 220 fails, an open circuit caused by the failure of the single emitter 220 will cause the current to be diverted through the corresponding bypass chip 242 to the next conductor 236. The failure of one single emitter 220 in series with the other emitters 220 will therefore not cause all the emitters on the pump layer 202 to cease functioning because of interruption of the series circuit. In this example, there are 24 single emitter chips 220 and corresponding open circuit bypass chips 242 on corresponding radial conductors 236 fabricated on or attached to the mounting surface 250 of the pump layer 202.

Returning to FIG. 2, the layers 202, 204, 206, 208 and 210 contain conduits and channels for coolant fluid from the pump to be pumped through the emitter module 104 to cool the heat generated by the single emitters 220 when emitting light to pump the laser rod 120. An outer O-ring 266 is placed on the perimeter of the pump layer 202. An inner O-ring 268 is placed on the pump layer 202 of the emitter module 104a to protect the laser emitter diode chips 220 and the conductor layer 212 from coolant fluid that flows between the adjacent emitter modules 104. Alternatively, separate O-rings may be used for each coolant conduit at the same level of the laser diodes emitters 220 on the mounting surface 250 of the pump layer 202. The O-ring 268 insulates the laser rod 120 from the coolant fluids flowing through the conduits and channels in the emitter module 104a. The layers 202, 204, 206, 208 and 210 are ceramic sheets in this example, but other materials such as stainless steel may be used for the layers 204, 206, 208 and 210. When made of LTCC, the sheets are bonded together in multiple layers by a thermal process that causes the glass molecules within the ceramic of each layer to bond together. Alternatively, the layers 202, 204, 206, 208 and 210 may be bonded together using adhesive layers. After the layers 202, 204, 206, 208 and 210 are bonded together, the bonding is used to ensure a seal of the fluid openings around a set of lateral coolant conduits 270 that are bored through the layer 204. The lateral conduits 270 provide the coolant fluid to the next emitter module 106 in FIG. 1 through the corresponding conduits on the bottom layer of the emitter 104b similar to the bottom layer 210 shown in FIG. 2. Each of the layers 202, 204, 206, 208 and 210 is processed to produce distinct internal lateral conduits or radial channels (such as by punching, laser etching, machining or molding) so that coolant channels are formed between the respective layers 202, 204, 206, 208 and 210 to allow the coolant fluid to pass through the microchannel cooler system of the emitter module 104a. Because the pump layer 202 of the emitter module 104a is electrically non-conductive, the pump layer 202 provides simultaneous thermal communication and electrical isolation between the laser diode emitters 220 and the coolant fluid is maintained.

In one example, the layers 202, 204, 206, 208 and 210 are manufactured using a "DuPont 951AX" LTCC material with a thickness of about ten mils (0.01 inches). Alternatively, the layers 202, 204, 206, 208 and 210 may be manufactured with a high-temperature cofired ceramic material ("HTCC"). Alternatively yet, any of the layers 202, 204, 206, 208 and 210 may be fabricated from a material selected from LTCC, HTCC, diamond, silicon carbide (SiC), aluminum nitride (AlN), cubic boron nitride (cBN), pyrex, silicon, sapphire, PEEK™ (Polyetheretherketone), beryllium oxide (BeO), glass, and other similar materials. In this example, the sheet material for the pump layer 202 is selected based on its low electrical conductivity characteristic and high thermal conductivity, which is needed to prevent the mixing of the coolant and the electrical current carried by the conductor layer 212. The pump layer 202 in this example is therefore fabricated from either aluminum nitride (AlN) or beryllium oxide (BeO).

As shown in FIG. 3, the pump layer 202 has six lateral coolant conduits 270 around the circumference of the pump layer 202 in this example. The lateral conduits 270 provide fluid transmission of coolant fluid to the next emitter module 104 in FIG. 1 after impingement of the coolant fluid on the bottom surface 252 of the pump layer 202 under the single emitters 220 as will be explained below.

Figure 5:
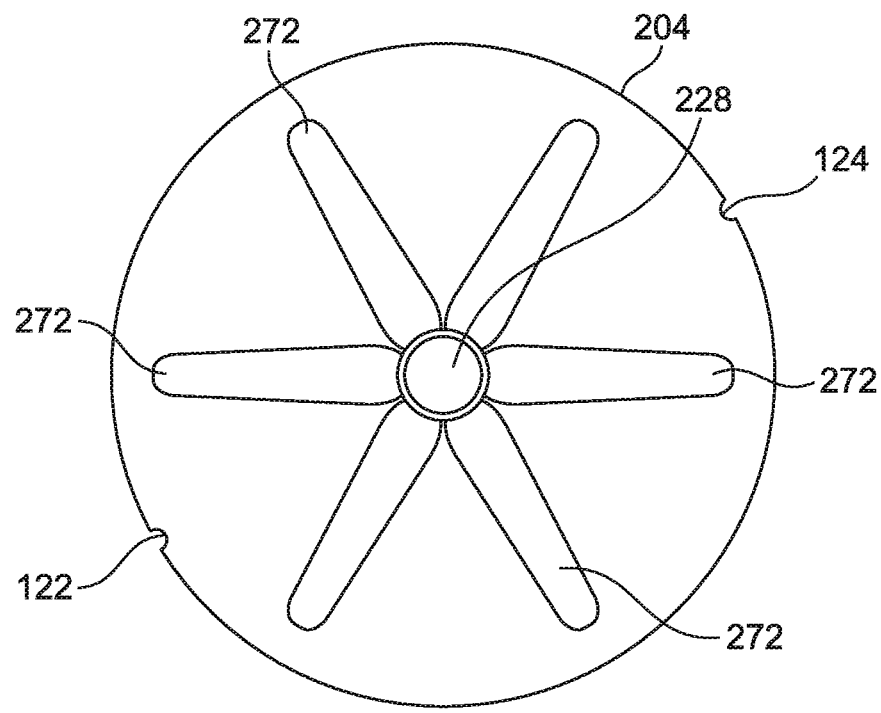
FIG. 5 is a top view of an intermediate layer that includes radial channels for the emitter module in FIG. 1; an FIG. 6 is a top view of the middle layer with microchannel impingement jets of the emitter module in FIG. 2.

FIG. 5 is a top view of the top intermediate layer 204 which is identical to the lower intermediate layer 208. The upper channel layer 204 includes the aperture 228 for the insertion of the laser rod 120 in FIG. 1. The top intermediate layer 204 has a series of radial channels 272 extending from near the aperture 228 to the edge of the layer 204. In this example there are six radial channels 272 each corresponding to the lateral conduits 270 of the pump layer 202. The radial channels 272 allow transmission of coolant fluid therethrough from near the aperture 228 to the circumference of the intermediate layer 204. Each of the radial channels 272 are fluidly coupled to the lateral conduits 270 of the pump layer 202. As shown in FIG. 2, corresponding radial channels 274 are formed in the lower intermediate layer 208 which are fluidly coupled to lateral conduits 276 of the bottom layer 210.

Figure 6:
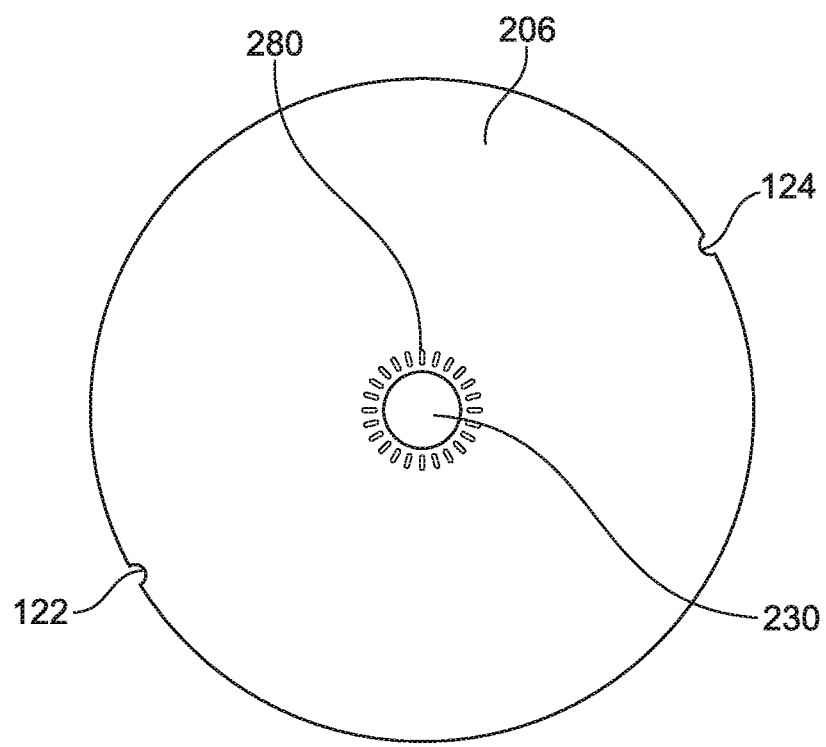

FIG. 6 is a top view of the middle layer 206. The middle layer 206 has a series of radial micro-channels 280 that are located near the center aperture 230. The laser rod 120 in FIG. 1 is inserted in the center aperture 230 and therefore is isolated from the coolant fluid flowing through the micro-channels 280. The micro-channels 280 allow jets of coolant fluid to impinge on the bottom surface 252 of the pump layer 202 to cool the emitters 220 when current is applied for the laser system operation. In this example, there is a single micro-channel 280 for each emitter 220. However, multiple micro-channels may be formed in the layer 206 for each of the emitters 220 on the pump layer 202. In this example, the micro-channels have dimensions of 4×36 mils. Typically, micro-channels may have dimensions between 4 and 50 mils.

The layers 202, 204, 206, 208 and 210 in the emitter module 104a function as a coolant manifold that diverts the coolant through the micro-channels 280 of the middle layer 206. The micro-channels 280 of the middle layer 206 are aligned with the areas of the bottom surface 252 of the pump layer 202 near the aperture 226 and therefore conduct heat from the single emitters 220 on the mounting surface 250. The pump layer 202 is a high-thermal conductivity material (e.g., AlN or BeO) because it is in direct contact with the conductor layer 212 mounting the single laser diode emitters 220 to be cooled with the coolant fluid. While the examples described below specifically refer to a particular type of micro-channel cooler arrangement, it is understood that alternative embodiments of the emitter module 104 include laminates of non-electrical conductors, semi-insulators, and high-resistivity materials.

Referring back to FIG. 2, the pump feeds coolant fluid to the six lateral conduits 276 of the bottom layer 210. The lateral conduits 276 guide the coolant to the distal end of the radial channels 274 of the bottom intermediate layer 208. The coolant travels from the distal end of the radial channels 274 to the proximal end of the radial channels 274 near the aperture 232 of the bottom intermediate layer 208. The coolant is then forced through the micro-channels 280 of the middle layer 206. The coolant is sprayed from the micro-channels 280 through the distal end of the radial channels 272 of the top intermediate layer 204 to impinge on the bottom surface 252 of the pump layer 202. Each of the micro-channels 280 are aligned radially to a corresponding single emitter 220 mounted on the pump layer 202. The coolant thus conducts heat from the emitters 220 on the mounting surface 250 of the pump layer 202. After impingement, the coolant travels from the proximal end of the radial channels 272 near the aperture 228 through the radial channels 272 to the distal ends of the radial channels 272. The coolant then is forced through the lateral conduits 270 of the pump layer 202. After exiting the conduits 270, the coolant is diverted to the corresponding lateral conduits of the bottom layer of the next emitter module 106 in FIG. 1.

The cooling arrangement from the assembly of the layer 202, 204, 206, 208 and 210 allows for the single emitters 220 to be mounted around the laser rod 120 at an even radial interval thereby resulting in high beam quality. The layer geometry and conduit and channel arrangement may be customized for any given application. The use of the single emitter chips 220 and the bypass chips 242 allows either series or parallel electrical connections of each single emitter chip 220 to the other emitter chips 220. The use of single emitters 220 provides higher reliability because the injected current may be lower than that used for an emitter bar. The injected current is lower as higher voltages are applied to the single laser diode emitters for the same power as a comparable number of emitters in an emitter bar. The advantage of higher voltages is that voltages are easier to control then current.

The laser system 100 in FIG. 1 with single emitters or small laser bars allows a smaller coolant manifold based on the layers 202, 204, 206, 208 and 210 of the emitter modules. The emitter modules may be fabricated more compactly and allow for uniform pumping of coolant to the single emitters because of the uniform placement of the emitters in relation to the laser rod. Further, the integrated circuits of the single emitters may be protected by the arrangement of the layers. The laser diode emitters are hard solder capable because of the underlying conductor layer 212.

The injected current for the single emitters is less than a comparable device using emitter bars while the operating voltage is higher since the single emitters 220 are wired in series. The system 100 allows short circuit and open circuit protection via the bypass chips 242 in FIGS. 2 and 3.

Figure 7A:
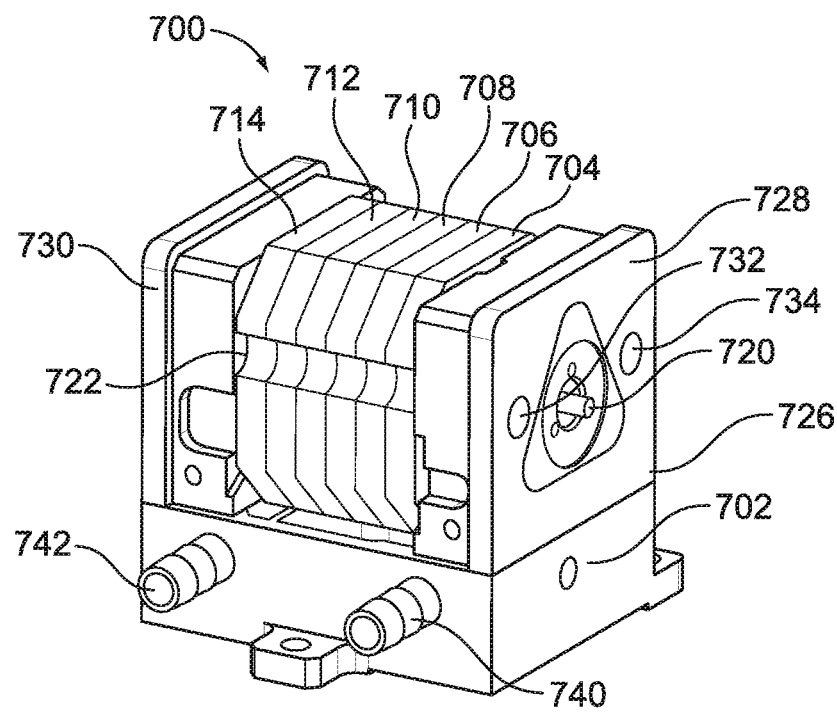
FIG. 7A is a perspective view of a laser system using another type of emitter module.
Figure 7B:
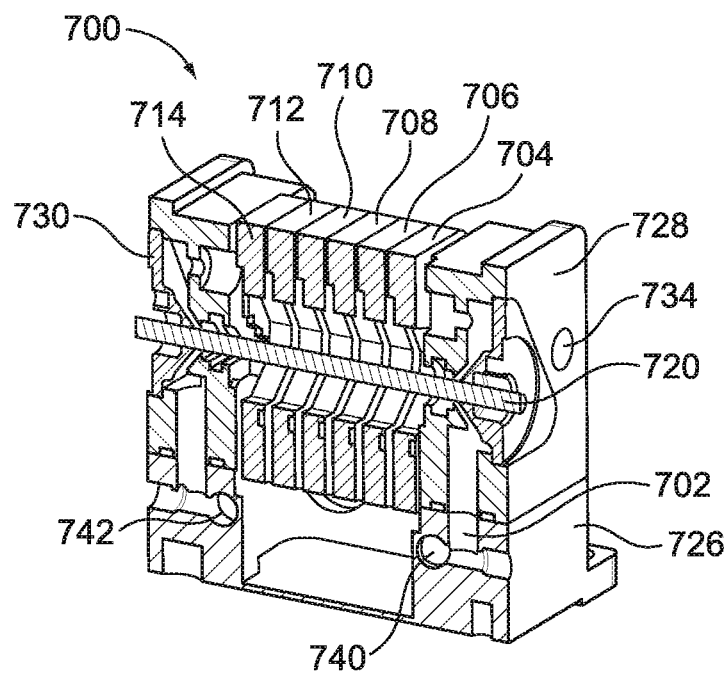
FIG. 7B is a cutaway perspective view of the laser system in FIG. 7A.

FIG. 7A is a perspective view of and FIG. 7B is a cross-section perspective view of another example laser system 700 allowing transverse emission of light to a laser medium such as a laser rod 720. The laser system 700 includes a transverse coolant system 702 and a series of emitter modules 704, 706, 708, 710, 712 and 714. In this example the emitter modules 704, 706, 708, 710, 712 and 714 have an octagonal outside shape with a nine-sided center aperture. Small laser diode emitter bars are arranged in transverse relation to the laser rod 720 at the center of the emitter modules 704, 706, 708, 710, 712 and 714. The emitter modules 704, 706, 708, 710, 712 and 714 each include a pair of notches 722 and 724. The emitter modules 704, 706, 708, 710, 712 and 714 rest on a chassis 726 with a front manifold 728 and a rear manifold 730. The emitter modules 704, 706, 708, 710, 712 and 714 are aligned together by rods that are fixed in the respective notches 722 and 724 and held by holes 732 and 734 in the respective manifolds 728 and 730.

An input pipe 740 supplies coolant flow from the emitter module 704 through each of the other emitter modules 706, 708, 710, 712 and 714 through the rear manifold 730 to an output pipe 742. The coolant fluid is pumped through the emitter modules 704, 706, 708, 710, 712 and 714 via the pump and removes heat generated by the laser emitters in the emitter modules 704, 706, 708, 710, 712 and 714. An electrical controller provides power to the laser diode emitters in the emitter modules 704, 706, 708, 710, 712 and 714.

FIG. 8A is an exploded perspective view of the components of one of the emitter modules such as the emitter module 704 in FIG. 1 having one set of single laser diode emitters of the laser system 700. The emitter module 704 includes a pump layer 802, a micro-channel middle layer 804 and a bottom layer 806. The pump layer 802 has a multi-sided center aperture 808 with a top mounting surface 810 and an opposite bottom surface 818. A series of emitter devices such as laser emitter bars 812 are mounted in angular relationship to the multi-sided center aperture 808. As in the previous example, the emitter devices may be mounted on a series of radial conductors (not shown) with bypass chips on the ends to insure operation of the emitters even if one of the emitters fails. In this example, the center aperture 808 has nine sides and thus there are nine laser emitter bars 812 that each have a number of laser diode emitter stripes that emit light transverse to the laser rod 720 as shown by the arrows in FIG. 8. In this example, each of the laser emitter bars 812 have five laser diode emitters and thus the emitter module 704 has a total of 45 laser diode emitters that emit light to the laser rod 720. The pump layer 802 has three inlet conduits 814 and three outlet conduits 816 that provide fluid communication for coolant fluid through the pump layer 802.

As shown in FIGS. 8B and 8C, the mounting surface 810 includes the emitter bars 812. The opposite bottom surface 818 includes a recess 820 formed around the aperture 808. A ring barrier 822 defines part of the recess 820 and serves to prevent fluid in the recess 820 from reaching the aperture 808. The recess 820 is roughly triangular in shape with the outlet conduits 816 at each of the corners of the recess 820.

Figure 8D:
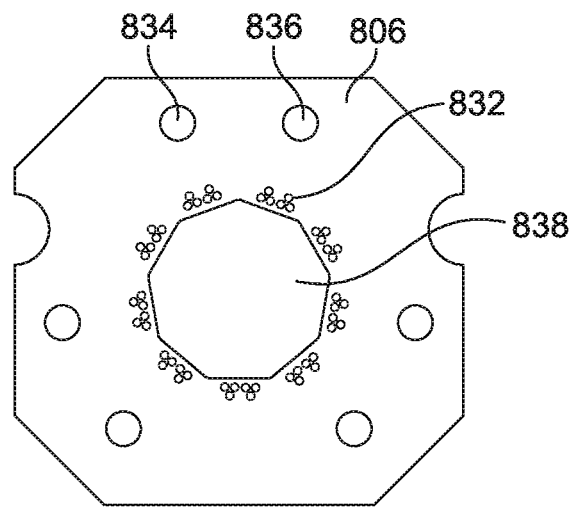
FIG. 8D is a top view of the middle layer with microchannels of the emitter module in FIG. 8A.

As shown in FIG. 8A and FIG. 8D, the middle layer 804 includes a plurality of micro-channels 832 that run under the bottom surface 818 of the pump layer 802 in proximity to the laser emitter bars 812. In this example, there are six micro-channels 832 grouped in two triangles for each of the laser emitter bars 812. In this example, each of the micro-channels 832 is 10 mils in diameter. The micro-channels 832 may range from 4 to 25 mils in diameter. Each of the groupings of micro-channels 832 are in proximity to an aperture 838 where the laser rod 720 in FIG. 7A is located. Of course there may be any variety of number of micro-channels 832 in any arrangement to direct coolant to impinge on the bottom surface 818 of the pump layer 802 opposite the laser emitter bars 812. The coolant fluid flow through the radial channels 832 and carries away the heat generated by the laser emitter bars 812. The coolant is fed to the radial channels 832 via a recess formed in the bottom layer 806 as will be explained below. The middle layer 804 also includes three inlet conduits 834 in fluid communication with the inlet conduits 814 of the pump layer 802 and three outlet conduits 836 in fluid communication with the outlet conduits 816 of the pump layer 802. The coolant therefore impinges the bottom surface 818 of the pump layer 802 opposite the laser emitter bars 812.

The bottom layer 806 includes a top surface 840 and an opposite bottom surface 842. The bottom layer 806 includes a multi-sided, center aperture 844 that is formed by a barrier 846. A recess 848 is formed on the top surface 840 partially by the opposite side of the barrier 846 from the aperture 840. The outside border of the recess 848 is roughly triangular in shape. The recess 848 channels coolant fluid from three inlet conduits 854 which are also in fluid communication with the inlet conduits 834 of the middle layer 804. The bottom layer 806 also includes three outlet conduits 856 that are in fluid communication with the outlet conduits 836 of the middle layer 804.

Coolant fluid is pumped through the three inlet conduits 854 of the bottom layer 806. Some of the fluid enters the recess 848 which is under the micro-channels 832 of the middle layer 804. The coolant fluid is forced through the micro-channels 832 to impinge on the bottom surface 818 of the pump layer 802 opposite the laser emitter bars 812. In doing so, the coolant fluid carries away the heat generated by the laser emitter bars 812. The returning coolant fluid then is trapped in the recess 820 on the bottom surface 818 of the pump layer 802. The coolant fluid is then carried away through the outlet conduits 816 through the respective outlet conduits 836 and 856 of the middle and bottom layers 804 and 806 to an outlet such as the outlet pipe 742 in FIG. 7 to the pump. The inlet conduits 814, 834 and 854 of the layers 802, 804 and 806 provide part of the coolant fluid flow not entering the recess 848 to the next emitter module such as the emitter module 706. The returned coolant fluid from the next emitter module 706 is also returned through the outlet conduits 816, 836 and 856 of the emitter module 704.

Figure 9:
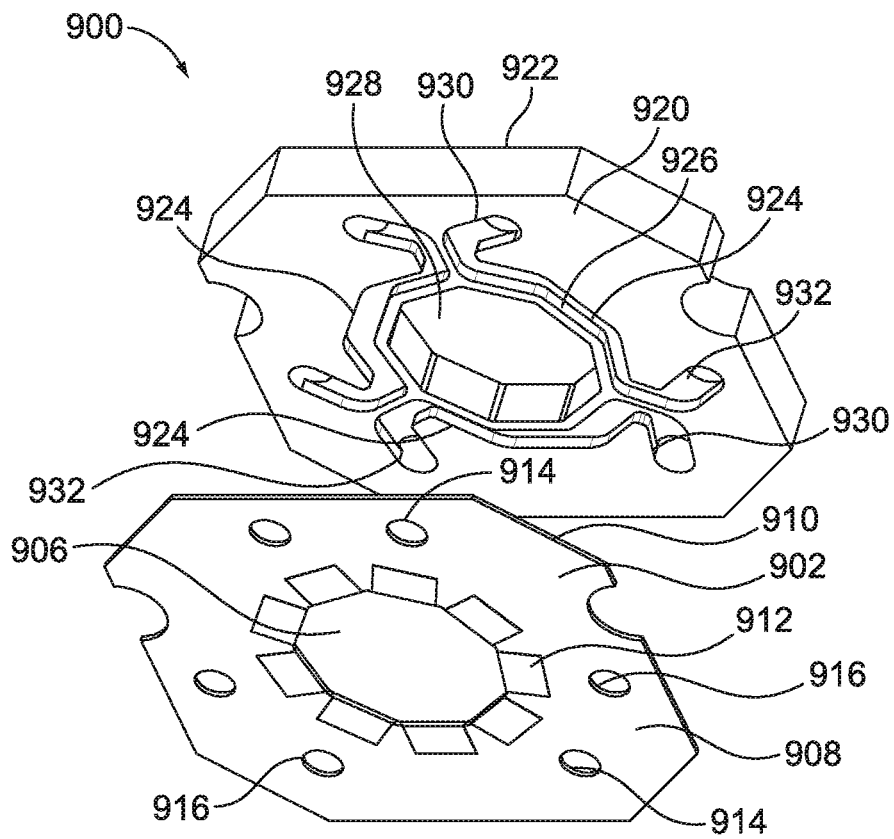
FIG. 9 is an exploded perspective view of an alternate design of an emitter module that may be employed in the laser system in FIG. 7A.

FIG. 9 is an exploded perspective view of another type of emitter module 900 having two layers that may be used in place of the three layer emitter modules such as the emitter module 704 in the laser system 700 in FIG. 7A. As with the emitter module 704, the emitter module 900 has an octagonal outer body. The emitter module 900 includes a pump layer 902 and a bottom layer 904. The pump layer 902 includes a center aperture 906. The pump layer 902 includes a top mounting surface 908 and an opposite bottom surface 910. The pump layer 902 includes a series of emitter devices such as laser emitter bars 912 are mounted in angular relationship to the sided center aperture 906. As with the emitter module 704, each emitter bar 912 has five laser diode emitters in a row, providing a total of forty five laser emitters in the emitter module 900. The laser emitter bars 912 emit light transversely relative to the laser rod as shown by the arrows in FIG. 9. The pump layer 902 includes three inlet conduits 914 and three outlet conduits 916 for the flow of coolant fluid.

The bottom layer 904 includes a contact surface 920 and an opposite bottom surface 922. A series of three channels 924 are formed on the contact surface 920. The channels 924 include a section 926 that runs on three sides of a center aperture 928. Each channel 924 has an inlet conduit 930 on one end and an outlet conduit 932 on the other end of the channel 924.

Coolant fluid is pumped into the three inlet conduits 930. The coolant is directed to the corresponding channels 924 and flows in the sections 926 that run under the bottom surface 910 of the pump layer 902 opposite the emitter bars 912. Thus, instead of impinging against the bottom surface as in the previous examples, the emitter 900 relies on coolant flow parallel to the plane of the pump layer 902. The fluid therefore carries away heat generated by the emitter bars 912. Each of the three channels 924 therefore cools three emitter bars 912. Of course, different numbers of channels may be used with a corresponding number of inlet and outlet conduits. The coolant fluid flows through the three channels 924 and returns via the outlet conduits 932. The coolant fluid flows through the inlet conduits 914 in the pump layer 902 to the next emitter module. Correspondingly, fluid returned from other emitter modules is returned through the outlet conduits 916 in the pump layer 902 and the outlet conduits 932 in the bottom layer 904.

While the present invention has been described with LTCC and HTCC, the microchannel coolers can be comprised of glass materials, such as low-temperature glasses. As used herein, "ceramic" should be understood to mean the inclusion of these glasses.

While the present invention has been described with reference to one or more particular embodiments, those skilled in the art will recognize that many changes may be made thereto without departing from the spirit and scope of the present invention. Each of these embodiments and obvious variations thereof is contemplated as falling within the spirit and scope of the claimed invention, which is set forth in the following claims.

What is claimed is:
1. A micro channel cooled laser apparatus, comprising:
   a laser medium having a central axis;

a pump layer having a mounting surface, an opposite bottom surface and a center aperture through which the laser medium is inserted;

a plurality of laser diode emitters disposed on the mounting surface of the pump layer circumferentially around the laser medium and emitting light directed at the laser medium;

an intermediate layer having at least one radial channel, the intermediate layer in contact with the bottom surface of the pump layer;

a middle layer having a plurality of micro-channels formed therethrough and a center aperture, the micro-channels being arranged around the center aperture, the middle layer in contact with the intermediate layer; and a coolant source fluidly coupled to the micro-channels via a conduit to allow coolant to be directed from the conduit through the micro-channels, wherein the micro-channels have a substantially smaller cross-section for coolant flow than the conduit to direct the coolant in a direction generally parallel to the central axis of the laser medium to form coolant jets to impinge on the bottom surface of the pump layer and flow through the at least one radial channel after impinging on the bottom surface.

2. The laser apparatus of claim 1, wherein the pump layer is a high thermal conductive material.

3. The laser apparatus of claim 2, wherein the high thermal conductive material is one of aluminum nitride or beryllium oxide.

4. The laser apparatus of claim 1, wherein the laser diode emitters are single laser diode emitters with a single light emission region.

5. The laser apparatus of claim 1, wherein the laser diode emitters are laser diode bars with a plurality of light emission stripes.

6. The laser apparatus of claim 1, wherein each of the plurality of laser diode emitters is mounted on a proximal end of a corresponding radial conductor disposed on the mounting surface of the pump layer, the radial conductors having an opposite distal end including an open-circuit bypass circuit, the open-circuit bypass circuit providing an electrical connection to a neighboring radial conductor if the corresponding laser diode emitter fails.

7. The laser apparatus of claim 6, further comprising a positive conductor and a negative conductor formed on the mounting surface of the pump layer, the positive conductor and negative conductor coupled in series to the plurality of laser emitters and the open-circuit bypass circuits via the radial conductors to supply voltage to the plurality of laser emitters.

8. The laser apparatus of claim 1, wherein the pump layer includes a plurality of coolant conduits located around the circumference of the pump layer and wherein the radial channel is one of a plurality of radial channels of the intermediate layer that in combination provide the plurality of micro-channels fluid access to the bottom surface of the pump layer opposite the plurality of laser diode emitters.

9. The laser apparatus of claim 1 wherein the layers are circular in shape and the aperture is substantially circular.

10. The laser apparatus of claim 1, further comprising:
a lower intermediate layer coupled to the middle layer, the lower intermediate layer including a center aperture and a plurality of radial channels, each of the radial channels of the lower intermediate layer having a proximal end and a distal end near the aperture in fluid communication with the plurality of micro-channels; and a bottom layer coupled to the lower intermediate layer, the bottom layer including a center aperture and a plurality of inlet conduits each in fluid communication with the proximal end of a corresponding radial channel of the lower intermediate layer.

11. A laser pump module comprising:
a laser medium having a length;
a plurality of ceramic coolers arranged along the length of the laser medium, each of the plurality of ceramic coolers including multiple layers having internal coolant flow channels for passing coolant fluid therethrough, each of the plurality of ceramic coolers having a center aperture through which the laser medium is positioned; and a plurality of groups of emitters for emitting energy in a direction transverse to the length, each of the groups of emitters being mounted on a corresponding one of the ceramic coolers such that the emitters are individually emitting energy toward the center aperture and into the laser medium, wherein the ceramic coolers include a layer having a plurality of micro-channels to form and direct coolant jets generally parallel to the length of the laser medium to impinge a back surface of one of the ceramic coolers opposite the groups of emitters, the plurality of micro-channels receiving coolant from a conduit, wherein the micro-channels have a substantially smaller cross-section for coolant flow than the conduit.

12. The laser pump module of claim 11, wherein each ceramic cooler includes at least one inlet and outlet for delivering coolant to the neighboring ceramic cooler.

13. The laser pump module of claim 11, wherein each ceramic cooler includes a layer having a mounting surface holding the groups of emitters and an opposite bottom surface, the coolant flow channels causing impingement flow of the coolant on the opposite bottom surface from the groups of emitters.

14. The laser pump module of claim 11, wherein each of the groups of emitters are mounted on a radial conductor, the radial conductor being coupled via a fault tolerant diode to an adjacent radial conductor.

15. A laser pump system comprising:
a laser medium having a length;
a plurality of laser emitters emitting energy in a direction transverse to the length of the laser medium, each of the plurality of laser emitters wired in a series circuit;
a pump layer having a mounting surface supporting the laser emitters, an opposite bottom surface, a center aperture and at least one fluid conduit located near the circumference of the pump layer; and
an intermediate layer having a channel system to form coolant jets by forcing coolant through micro-channels and to guide the coolant jets to contact against the bottom surface of the pump layer substantially opposite the laser emitters and flow through the channel system to the at least one fluid conduit.

16. The laser pump system of claim 15, further comprising a micro-channel layer disposed between the intermediate layer and the pump layer, the micro-channel layer including the plurality of micro-channels guiding the coolant in a direction generally parallel to the length of the laser medium, wherein the channel system includes a recess that supplies coolant fluid to the micro-channels to cause coolant fluid to impinge on the bottom surface of the pump layer and wherein the opposite bottom surface of the pump layer has a recess having fluid access to the micro-channels, the recess having fluid access to the fluid conduit to return the coolant fluid.

17. The laser pump system of claim 16, wherein the channel system includes at least one conduit to guide coolant flow to another coolant manifold resting on the coolant manifold.

18. The laser pump system of claim 15, further comprising a micro-channel layer disposed under the intermediate layer and the pump layer, the micro-channel layer including a plurality of micro-channels guiding the coolant in a direction generally parallel to the length of the laser medium, wherein the channel system includes a plurality of radial channels for collecting coolant fluid from the micro-channels and guiding the coolant fluid through the fluid conduit of the pump layer.

19. The laser pump system of claim 18, wherein the channel system of the intermediate layer includes at least one channel running under the bottom surface of the pump layer and an inlet for the coolant fluid, the channel allowing coolant fluid to exit through the fluid conduit of the pump layer.

20. The laser pump system of claim 15, wherein the laser emitters are single laser diode emitters with a single light emission region or laser diode bars with a plurality of light emission stripes.

21. The micro channel cooled laser apparatus of claim 1, wherein each of the micro-channels are disposed on the middle layer to be in substantial alignment directly under an area of the bottom surface of the pump layer opposite one of the plurality of laser diode emitters.

* * * * *